United States Patent
Bisschops

(10) Patent No.: US 6,493,423 B1
(45) Date of Patent: Dec. 10, 2002

(54) METHOD OF GENERATING EXTREMELY SHORT-WAVE RADIATION, METHOD OF MANUFACTURING A DEVICE BY MEANS OF SAID RADIATION, EXTREMELY SHORT-WAVE RADIATION SOURCE UNIT AND LITHOGRAPHIC PROJECTION APPARATUS PROVIDED WITH SUCH A RADIATION SOURCE UNIT

(75) Inventor: Theodorus Hubertus Josephus Bisschops, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 110 days.

(21) Appl. No.: 09/726,768

(22) Filed: Nov. 30, 2000

(30) Foreign Application Priority Data

Dec. 24, 1999 (EP) .............................. 99204534

(51) Int. Cl.$^7$ ................................ G21K 5/00
(52) U.S. Cl. ..................... 378/119; 378/34; 378/143
(58) Field of Search ................. 378/119, 143, 378/34

(56) References Cited

U.S. PATENT DOCUMENTS

| | | | |
|---|---|---|---|
| 4,723,262 A | 2/1988 | Noda et al. ............ | 378/119 |
| 5,153,898 A | 10/1992 | Suzuki et al. ............ | 378/34 |
| 5,459,771 A * | 10/1995 | Richardson et al. ........ | 378/119 |
| 5,577,091 A * | 11/1996 | Richardson et al. ........ | 378/119 |
| 5,577,092 A * | 11/1996 | Kublak et al. ............ | 378/119 |
| 5,770,126 A | 6/1998 | Singh et al. ............ | 264/8 |
| 5,991,360 A * | 11/1999 | Matsui et al. ............ | 378/119 |
| 6,002,744 A * | 12/1999 | Hertz et al. ............ | 378/119 |
| 6,285,743 B1 * | 9/2001 | Kondo et al. ............ | 378/119 |
| 6,304,630 B1 * | 10/2001 | Bisschops et al. ........ | 378/119 |
| 6,377,651 B1 * | 4/2002 | Richardson et al. ........ | 378/34 |

FOREIGN PATENT DOCUMENTS

| | | |
|---|---|---|
| EP | 0779528 A2 | 6/1997 |
| WO | 9733204 A1 | 9/1997 |
| WO | 9951357 A1 | 10/1999 |

OTHER PUBLICATIONS

"Characterization and Control of Laser Plasma Flux Parameters for Soft X–Ray Projection Lithography", in Applied Optics, vol. 32, No. 34, Dec. 1, 1993, pp. 6901–6910.
"Front–end Design issues in Soft X–Ray Lithography" in Applied Optics, vol. 23, No. 34, Dec. 1, 1993, pp. 7050–7056.
"Applications of High Field and Short Wavelength Sources", VIII, 1999.
"Debris Elimination in a Droplet–Target Laser–Plasma Soft X–Ray Source", by L. Rymell et al., Rev. Sci, Instrum. 66, No. 10, Oct. 1995.
"Debris–Free Soft X–Ray Generation using a Liquid Droplet Laser–Plasma Target", H.M. Hertz et al., SPIE vol. 2523.
"Exit Flow Properties of Annular Jet–Diffuser Ejectors", by Rong–Che Chen, Journal of the Chinese Society of Mechnical Engineers, vol. 18, No. 2, 1997.
"Laser Produced Oxygen Plasmas", by J. Jonkers et al., Philips Researc Labs, Eindhoven, The Netherlands.

* cited by examiner

Primary Examiner—Robert H. Kim
Assistant Examiner—Allen C. Ho
(74) Attorney, Agent, or Firm—Aaron Waxler

(57) ABSTRACT

A method is described for generating EUV radiation, comprising the steps of generating a flow of a medium (39); transporting this medium through a source space (60) connected to a vacuum pump (75), and irradiating part of the medium with an intensive, pulsed laser beam (41) focused on said part of the medium, thus creating a plasma (47) which emits EUV radiation. In order to maintain a vacuum in the source space and to prevent elements of the medium, like vapor or elementary particles, from leaving the source space through apertures (63, 64) provided in the wall of the space for passing the laser beam and EUV radiation, the flow of medium is embedded in a flow of rare gas. The invention also describes an EUV radiation source unit for performing the method and the application of the method in the manufacture of devices like IC devices, and in a lithographic projection apparatus.

22 Claims, 6 Drawing Sheets

METHOD OF GENERATING EXTREMELY SHORT-WAVE RADIATION, METHOD OF MANUFACTURING A DEVICE BY MEANS OF SAID RADIATION, EXTREMELY SHORT-WAVE RADIATION SOURCE UNIT AND LITHOGRAPHIC PROJECTION APPARATUS PROVIDED WITH SUCH A RADIATION SOURCE UNIT

BACKGROUND OF THE INVENTION

The invention relates to a method of generating extremely short-wave radiation, in which a medium is transported through a vacuum space and each time a part of the medium in the vacuum space is irradiated with a pulsed and focused energy-rich laser beam, said part of the medium being converted into a plasma emitting extremely short-wave radiation.

The invention also relates to a method of manufacturing a device by means of this radiation. Furthermore, the invention relates to an extremely short-wave radiation source unit and to a lithographic projection apparatus provided with such a radiation source unit.

Extremely short-wave radiation is understood to mean extreme UV (EUV) radiation, which can be used in lithographic projection apparatuses, and X-ray radiation for various applications.

Said medium may be a mobile medium, i.e. a medium which does not have a solid shape but whose shape is determined by the holder accommodating the medium or the guide by which the medium is transported. However, the medium may be alternatively a solid medium such as a metal which can be locally exploded by laser beam bombardment, in which the released particles form a plasma emitting extremely short-wave radiation. The metal medium may be a tape or a wire transported through the vacuum, or source space.

A lithographic apparatus is used, inter alia, in the manufacture of integrated electronic circuits or ICs for imaging an IC mask pattern, present in a mask, each time on a different IC area of a substrate. This substrate, which is coated with a radiation-sensitive layer, provides space for a large number of IC areas. The lithographic apparatus may also be used in the manufacture of, for example, liquid crystalline image display panels, integrated, or planar optical systems, charge-coupled detectors (CCDs) or magnetic heads.

Since an increasingly large number of electronic components is to be accommodated in an IC, increasingly smaller details, or line widths, of IC patterns must be imaged. Consequently, increasingly stricter requirements are imposed on the imaging quality and the resolving power of the projection system in the apparatus, which projection system is generally a lens system in the current lithographic apparatuses. The resolving power, which is a measure of the smallest detail which can still be imaged, is proportional to $\lambda/NA$, in which $\lambda$ is the wavelength of the imaging, or projection, beam and NA is the numerical aperture of the projection system. To increase the resolving power, the numerical aperture may, in principle, be enlarged and/or the wavelength may be reduced. An increase of the currently already fairly large numerical aperture is no longer very well possible in practice because the depth of focus of the projection system, which is proportional to $\lambda/NA^2$, will become too small and the correction for the required image field will be too difficult.

The requirements to be imposed on the projection system may be mitigated, or the resolving power may be increased while these requirements are maintained if a step-and-scan lithographic apparatus is used instead of a stepping lithographic apparatus. In a stepping apparatus, a full-field illumination is used, i.e. the entire mask pattern is illuminated in one run and imaged as one whole on an IC area of the substrate. After a first IC area has been illuminated, a step is made to a subsequent IC area, i.e. the substrate holder is moved in such a way that the next IC area is positioned under the mask pattern, whereafter this area is illuminated, and so forth, until all IC areas of the substrate are provided with a mask pattern. In a step-and-scan apparatus, only a rectangular or annular segment-shaped area of the mask pattern and hence a corresponding sub-area of a substrate IC is illuminated, and the mask pattern and the substrate are synchronously moved through the illumination beam, while taking the magnification of the projection system into account. A subsequent area of the mask pattern is then each time imaged on a corresponding sub-area of the relevant IC area of the substrate. After the entire mask pattern has been imaged on an IC area in this way, the substrate holder performs a step, i.e. the start of a subsequent IC area is introduced into the projection beam and the mask is set, for example, to its initial position whereafter said subsequent IC area is scan-illuminated via the mask pattern.

If even smaller details are to be satisfactorily imaged with a step-and-scan lithographic apparatus, the only possibility is to reduce the wavelength of the projection beam. In the current step-and-scan apparatuses, deep UV (DUV) radiation is already used, i.e. radiation having a wavelength of the order of several hundred nanometers, for example, 248 nm or 193 nm from, for example, an excimer laser. Another possibility is the use of extreme UV (EUV) radiation, also referred to as soft X-ray radiation, with a wavelength in the area of several nm to several tens of nm. Extremely small details, of the order of 0.1 $\mu$m or smaller, can be satisfactorily imaged with such a radiation.

Since there is no suitable lens material available for EUV radiation, a mirror projection system must be used for imaging the mask pattern of the substrate, instead of a hitherto conventional lens projection system. For forming a suitable illumination beam of the radiation from the EUV radiation source, mirrors are also used in the illumination system. The article "Front-end design issues in soft-X-ray lithography" in Applied Optics, Vol. 23, No. 34, 01-12-93, pp. 7050–56 describes a lithographic apparatus in which EUV radiation is used and whose illumination system comprises three mirrors and the imaging, or projection, system comprises four mirrors. As is described in the article "Debris-free soft X-ray generation using a liquid droplet laser plasma target" in: Applications of laser plasma radiation II, SPIE 2523, 1995, pp. 88–93, EUV radiation can be generated by focusing a laser beam on water droplets. The required stable flux of individual micro water droplets can be obtained by means of a capillary glass tube which is vibrated by a piezoelectric driver. Due to the high temperature, each water droplet impinged upon by the laser beam is consecutively converted into a plasma which emits EUV radiation.

In EUV lithographic apparatuses, it is a great problem to illuminate the substrate at a sufficiently high intensity. A first cause of this problem, which applies to all EUV apparatuses, is that the mirrors used are considerably less than 100% reflecting. Each of these mirrors has a multilayer structure whose composition is adapted as satisfactorily as possible to the wavelength of the projection beam used. Examples of such multilayer structures are described in U.S. Pat. No. 5,153,898. A multilayer structure which is frequently mentioned in literature is the structure consisting of silicon layers alternating with molybdenum layers. For radiation coming from a plasma source, these layers theoretically have a reflection of the order of 73% to 75%, but in practice the reflection is currently not larger than 65%. When said number of seven mirrors is used, each with a reflection of 68%, only 6.7% of the radiation emitted by the source reaches the substrate. For a lithographic apparatus, this means in practice that the illumination time should be relatively long in order to obtain the desired quantity of radiation energy on a substrate, and that the scanning velocity would be relatively small, particularly for a scanning apparatus. However, it is essential for these apparatuses that the scanning velocity is as high as possible and the illumination time is as short as possible so that the throughput, i.e. the number of substrates which can be illuminated per unit of time, is as high as possible. This can only be achieved with an EUV radiation source which supplies sufficient intensity. A second cause of the problem relates to the fact that the generated EUV radiation may be absorbed as little as possible, which means that the product of the path length traversed by the EUV radiation and the pressure in the space in which this radiation propagates must not exceed a given value. This space must be a vacuum space with a pressure of, for example, the order of 0.1 mbar if said path length is of the order of 1 m. For a larger path length, the vacuum requirement is also stricter, for example, the pressure in the vacuum space must not be higher than $10^{-3}$ mbar. In a water plasma source, there is the problem that the vapor pressure of water at room temperature is approximately 23 mbar, which does not comply with the vacuum requirement which must also be maintained in the holder of the radiation source. Moreover, the water vapor may get through the apertures provided in the holder for passing the laser beam and leave this holder so that it will deposit on the mirrors of the illumination system and the projection system and attack these mirrors, thus reducing their reflection. Similar problems occur when other liquids and gases are used as starting media for generating EUV radiation. Such a gas is, for example, xenon in the form of clusters. As regards physical state, such xenon clusters occupy a position between molecules and a solid material. When a cluster is irradiated with a high-power laser beam, the cluster emits EUV radiation. Inter alia, also energy-rich ions are then released, which may cause great damage. Also when a metal tape or wire is bombarded with a laser beam so as to generate EUV radiation, particles are released which may cause damage and may absorb the EUV radiation.

SUMMARY OF THE INVENTION

It is an object of the present invention to provide a method in which the above-mentioned problems in EUV sources, and similar problems in X-ray sources, can be obviated. To this end, this method is characterized in that the medium is embedded in at least a viscous flow of rare gas which is transported through the vacuum space parallel to the direction of movement of the medium.

Vapor deposited from the mobile medium, excess medium which has not been converted into plasma and particles repelled by the plasma formed are taken along by the flow of rare gas and transported to the vacuum pump for the source space. It is thus achieved that the vacuum, or source, space remains sufficiently transparent to the extremely short-wave radiation, and it is sufficiently prevented that said elements of the medium can penetrate other spaces of the apparatus in which the mirrors of the illumination system and those of the projection system are situated. The flow of rare gas is a viscous flow so that it exerts a sufficiently large suction on the matter to be removed. The flow is preferably a laminar flow so that a return flow of the rare gas, and the elements of the medium present therein, is suppressed very effectively.

The method is preferably further characterized in that two viscous flows of rare gas are passed through a part of the vacuum space in which a part of the medium, which is not yet irradiated, propagates.

By making use of two or more extra flows of rare gas, the velocity profile of the rare gas, which profile may be disturbed by an interaction of the moving medium with the rare gas, can be restored.

The method is preferably further characterized in that helium is used as a rare gas.

The envisaged object can be eminently realized with helium which is the lightest of the rare gases and absorbs little extremely short-wave radiation. Instead of helium, for example, also argon may be used, which, on the one hand, can better drain the medium elements but, on the other hand, is more absorbing than helium.

It is to be noted that the article "Characterization and control of laser plasma flux parameters for soft X-ray lithography" in Applied Optics, Vol. 32, No. 4, 01-12-93, pp. 6910–6930 describes an EUV radiation source based on a metal medium and deals with a problem that may be caused by particles coming from the metal. It is proposed to fill the source space with helium at such a pressure that, on the one hand, collisions prevent the source particles from moving away from the source and, on the other hand, a minimal quantity of EUV radiation is absorbed by the helium. To this end, the helium must fill the entire source space so that more helium is required and the risk of absorption of EUV radiation is greater than in the radiation source unit according to the invention. The specific problems, which occur when liquid or gaseous media are used, are not mentioned in the article.

Furthermore, it is noted in the article "Debris-free soft X-ray generation using a liquid droplet laser plasma target" in SPIE, Vol. 2523, Applications of laser plasma radiation II, 1995, pp. 88–93 that the number of contaminated particles formed during irradiation of ethanol or water droplets for generating EUV radiation, is three times smaller than the number of particles for irradiating a solid material. Then, however, source particles may still reach optical elements of the apparatus in which the EUV radiation is used. To avoid this, the article proposes use of a localized flow of rare gas. However, this flow is passed along the surface of the optical elements to be protected and is not passed through the source space. However, a larger quantity of helium is required for this purpose, and the absorption is greater again.

A first embodiment of the method is characterized in that a metal is used as a medium which, upon irradiation with a laser beam, forms a plasma emitting extremely short-wave radiation.

For the metal medium, various metals such as iron, tin and carbon are suitable. This medium preferably has the shape of a tape or a wire. A second embodiment of the method is characterized in that a liquid is used as a medium which, upon irradiation with a laser beam, forms a plasma emitting extremely short-wave radiation.

This embodiment is preferably further characterized in that a continuous flow of individual water droplets is used as the flow of liquid medium.

Water is a relatively clean medium and good results have already been achieved with a radiation source in which a flow of water droplets is used.

A third embodiment of the method is characterized in that a clustered gas is used as a medium which, upon irradiation with a laser beam, forms a plasma emitting extremely short-wave radiation.

This embodiment is preferably further characterized in that the gas is xenon.

Good results appear to be achieved with an extremely short-wave radiation source in which this gas is used.

The invention also relates to a method of manufacturing a device, in which the dimensions of the smallest details are smaller than 0.25 μm, on a substrate, in which method different layers of the device are formed in successive steps by imaging by means of EUV radiation, for each layer, first a specific mask pattern on the substrate coated with a radiation-sensitive layer and by subsequently removing material from, or adding material to, areas marked by the mask image. This method is characterized in that the EUV radiation is generated by means of the method described hereinbefore.

The invention further relates to an extremely short-wave radiation source unit comprising:

a source space connected on a first side to a vacuum pump;

an inlet device on a second side of the source space for introducing the medium into the source space;

a pulsed high-power laser, and an optical system for focusing the laser beam supplied by the laser on a fixed position within the source space where it passes. This radiation source unit is characterized in that the source space is connected on the second side to a rare gas inlet for establishing a viscous flow of rare gas in the source space enveloping the medium, which flow is parallel to the direction of movement of the medium.

A first embodiment of this radiation source unit, in which the source space is enclosed by a wall having apertures for causing the laser beam to enter into and exit from the source space and for causing the generated extremely short-wave radiation to exit from the source space, is characterized in that a tube is arranged in the source space on the second side of the source space and parallel to the direction of movement of the medium, which tube is connected to said inlet for establishing the viscous flow of rare gas.

This embodiment is preferably further characterized in that a second tube is arranged parallel to the first tube in the source space, which second tube is connected to said inlet for establishing a second viscous flow of rare gas parallel to the direction of movement of the medium.

A second embodiment of the radiation source unit is characterized in that the source space is formed by a first closed part on the first side, a second closed part on the second side and a central part which communicates with the ambience, in that the wall of the second source space part is formed by a tube which is connected to said rare gas inlet, and in that the wall of the tube and the wall of the first source space part have such a shape at the area of the central part of the source space that they constitute an ejector geometry.

Due to the extra suction caused by the ejector, or jet pump, geometry, it is prevented that rare gas can leak through the apertures and raise the pressure in the apparatus spaces accommodating optical components.

A third embodiment of the radiation source unit is characterized in that the source space is formed by a first closed part on the first side, a second closed part on the second side and a central part which communicates with the ambience, in that the wall of the second source space part is formed by an annular tube which is connected to said rare gas inlet, and in that the wall of the tube and the wall of the first source space part have such a shape at the area of the central part of the source space that they constitute an annular ejector geometry.

As compared with the second embodiment, this embodiment has the advantage that the tube which is a part of the jet pump is narrow so that a satisfactory operation of this pump is ensured, and that it also provides the possibility to create some distance between the focus of the laser beam and the position where the medium passes. Especially for the case where liquid droplets or gas clusters are used as a medium, the risk that a droplet or cluster is not impinged upon by the laser beam will be smaller. Since the density of the laser energy in this droplet or cluster then remains limited, the number of energy-rich ions and radicals repelled by the plasma may also remain limited.

A metal, a gas or a liquid may be used as a mobile, plasma-forming medium in the above-mentioned radiation source unit, as defined in claims 15–21.

Finally, the invention relates to a lithographic projection apparatus for imaging a mask pattern on a substrate provided with a radiation-sensitive layer, which apparatus comprises an illumination system for illuminating the mask pattern and a projection system for imaging the illuminated mask pattern on the substrate, the illumination system comprising an EUV radiation source, while the optical components of the illumination system and those of the projection system are present in a vacuum space. This apparatus is characterized in that the EUV radiation source is an EUV radiation source unit as described hereinbefore.

These and other aspects of the invention are apparent from and will be elucidated with reference to the embodiments described hereinafter.

DESCRIPTION OF THE PREFERRED EMBODIMENTS

Figure 1:
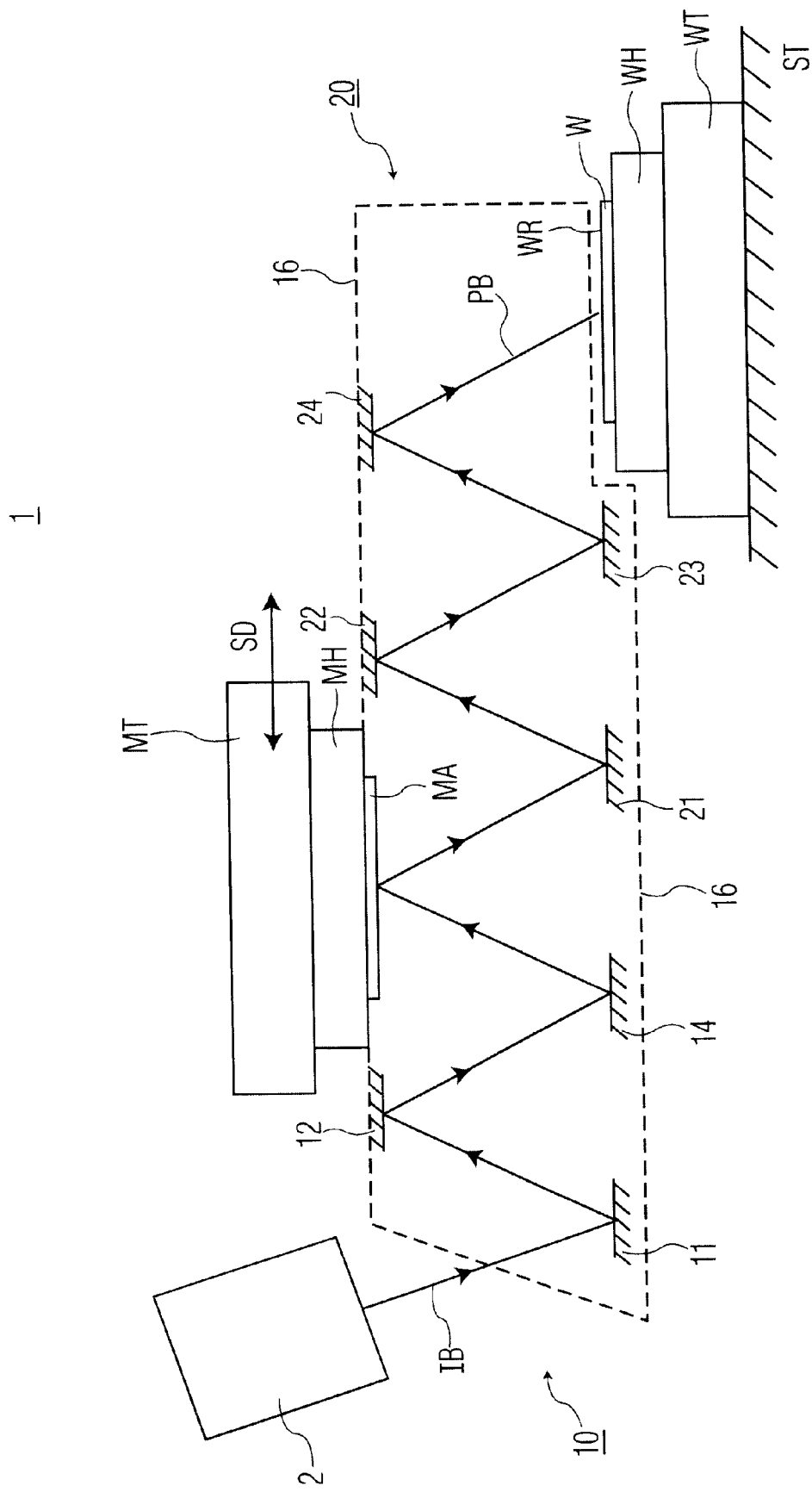
FIG. 1 shows a first embodiment of a step-and-scan lithographic projection apparatus in which the radiation source unit according to the invention may be used.

FIG. 1 shows diagrammatically an embodiment of a step-and-scan lithographic projection apparatus 1 in which an EUV radiation source according to the invention may be used and with which the method according to the invention may be performed. The apparatus comprises an illumination system for illuminating a mask MA and a mirror projection system for imaging a mask pattern, present in the mask, on a substrate W, for example, a semiconductor substrate which is provided with an EUV radiation-sensitive photoresist WR. The illumination system 10 shown in the left-hand part of FIG. 1 is designed in known manner in such a way that the illumination beam IB supplied by the system at the area of the mask MA has a cross-section in the form of an annular segment or a rectangle, and has a uniform intensity. The illumination system comprises, for example, three mirrors 11, 12 and 13 which are maximally reflecting for EUV radiation at, for example, a wavelength of the order of 13 nm because they have a multilayer structure of, for example, silicon layers alternating with molybdenum layers. The mask MA is arranged in a mask holder MH which forms part of a mask table MT. By means of this table, the mask can be moved in the scanning direction SD and possibly in a second direction perpendicular to the plane of the drawing, such that all areas of the mask pattern can be introduced under the illumination spot formed by the illumination beam IB. the mask table and the mask holder are shown only diagrammatically and may be constructed in different ways. The substrate W to be illuminated is arranged in a substrate holder WH which is supported by a substrate table WT, also referred to as stage. This table can move the substrate in the scanning direction SD but also in a direction perpendicular to the plane of the drawing. The substrate table is supported, for example, by a table bearing ST. For further details of a step-and-scan apparatus, reference is made by way of example to PCT patent application WO 97/33204 (PHQ 96004).

For imaging the mask pattern on the substrate with a reduction of, for example, 4x, a mirror projection system 20 comprising, for example, four mirrors 21, 22, 23 and 24 is arranged between the mask and the substrate. For the sake of simplicity, the mirrors are shown as plane mirrors but actually these mirrors, as well as those of the illumination system 10, are concave and convex mirrors and the mirror projection system 20 is designed in such a way that the desired sharp image is realized at a reduction of, for example 4x. The design of the mirror projection system does not form part of the present patent application. Analogously as the mirrors of the illumination system, each mirror 21, 22, 23 and 24 is provided with a multilayer structure of first layers having a first refractive index, alternating with second layers having a second refractive index.

Instead of four mirrors, the mirror projection system may alternatively comprise a different number of mirrors, for example, three, five or six. Generally, the accuracy of the image will be greater as the number of mirrors is larger, but there will be more radiation loss. Thus, a compromise will have to be found between the quality of the image and the radiation intensity on the substrate, which intensity also determines the velocity at which the substrates are illuminated and can be passed through the apparatus. Mirror projection systems having four, five or six mirrors for lithographic apparatuses are known per se. For example, a six-mirror system is described in EP-A 0 779 528.

Since EUV radiation is absorbed by air, the space in which this radiation propagates must be a highly vacuum-exhausted space. Minimally, both the illumination system, from the radiation source to the mask, and the projection system, from the mask to the substrate, must be arranged in a vacuum-tight space, which is denoted by means of the envelope 16 in FIG. 1. Instead of being accommodated in the same envelope, the illumination system and the projection system may be alternatively accommodated in separate envelopes.

Figure 2:
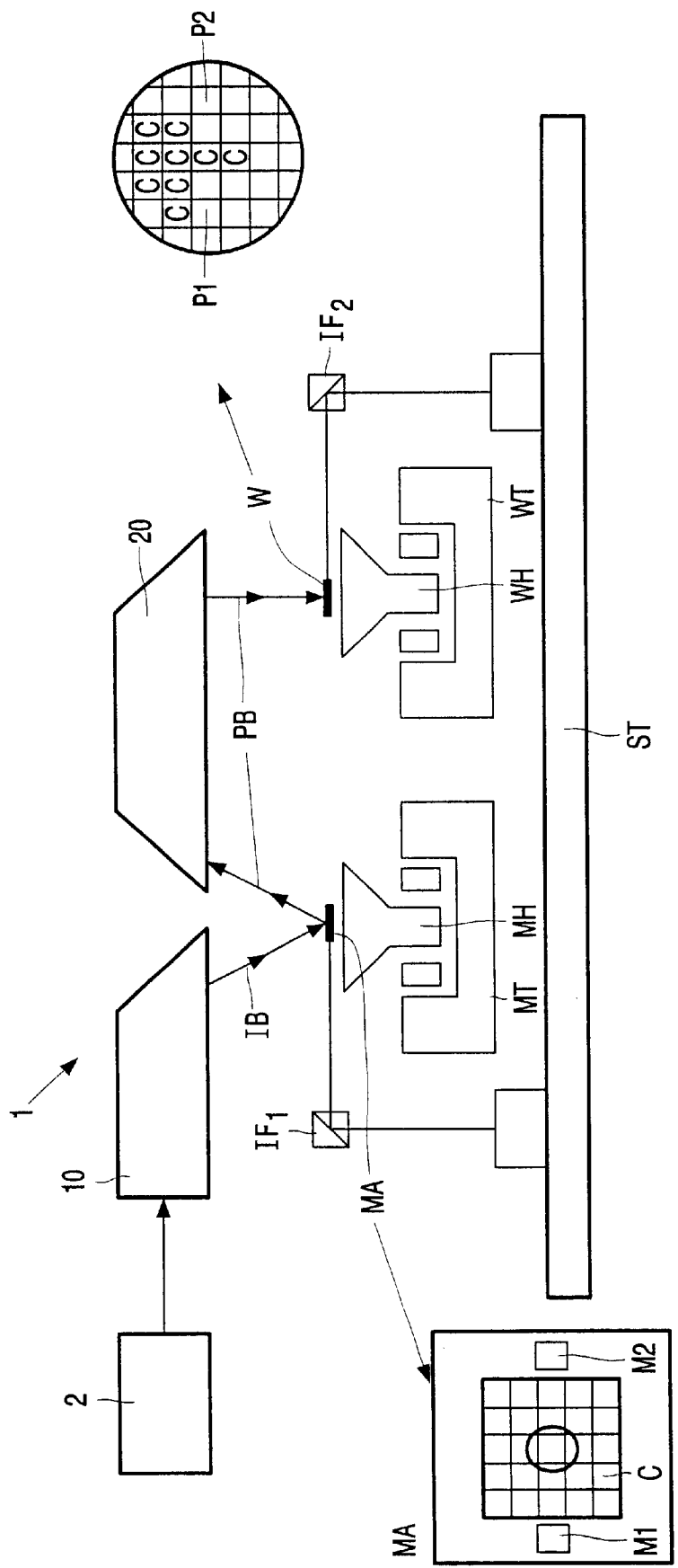
FIG. 2 shows a second embodiment of such an apparatus.

The mask MA and the substrate W may be juxtaposed, as shown in FIG. 2, instead of opposite each other. In this Figure, the components corresponding to those in FIG. 1 have the same reference numerals or symbols. The separate mirrors of the illumination system are not shown in FIG. 2 but form part of the block 10 representing the illumination system, with which the illumination beam is given the desired shape and the uniform intensity. FIG. 2 is a plan view of a mask with a mask pattern C and a plan view of a substrate W with substrate fields, with an image of the mask pattern C being formed on each field. The mask and the substrate comprise two or more alignment marks M1 and M2, and P1 and P2, respectively, each, which are used for aligning the mask pattern with respect to the substrate or with respect to each substrate field separately before the mask pattern is projected. For checking the movements of the mask and the substrate, the lithographic projection apparatus comprises very accurate measuring systems, preferably in the form of interferometer systems IF 1 and IF2.

Figure 3:
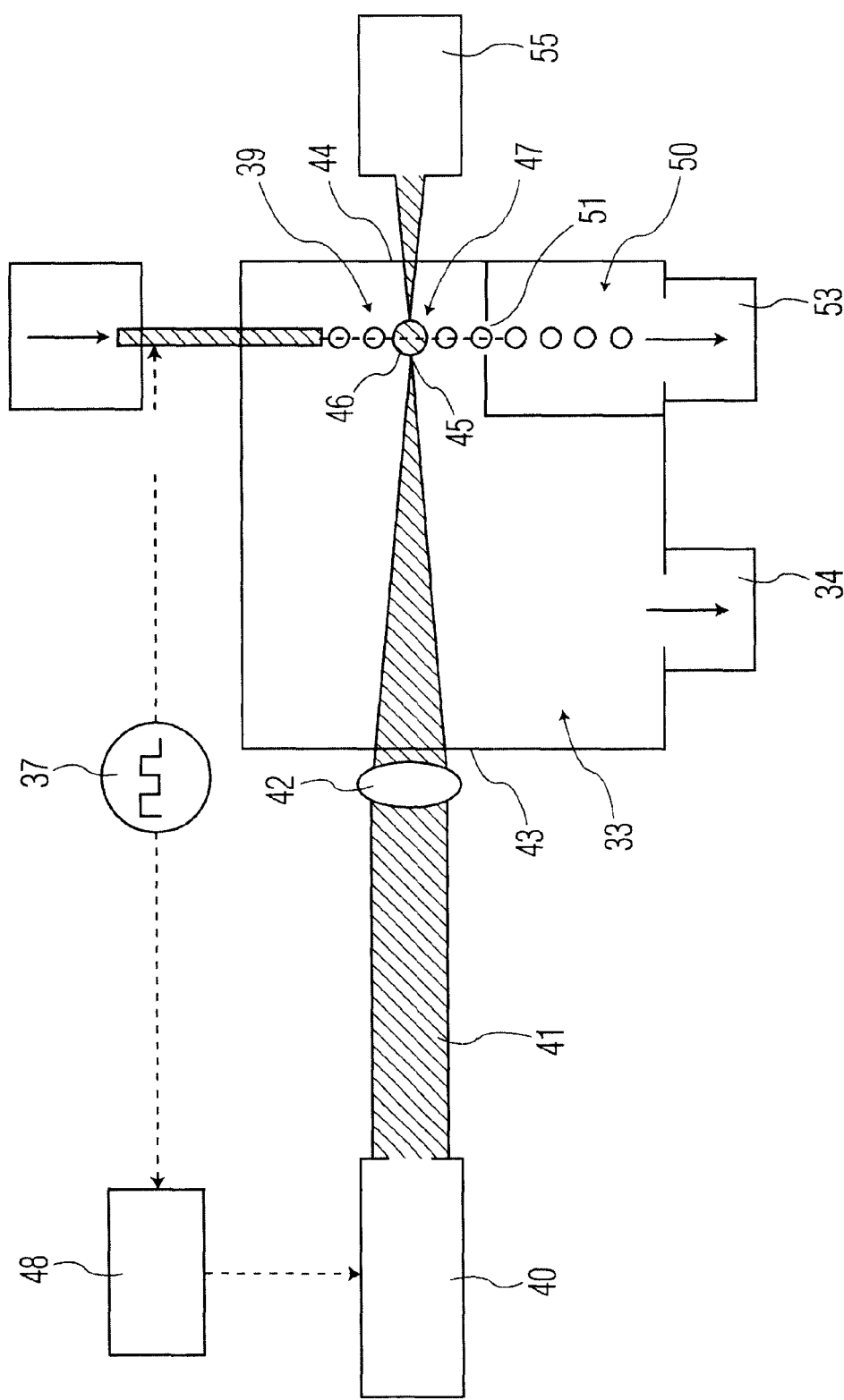
FIG. 3 is a cross-section of a known embodiment of an EUV radiation source unit.

The block denoted by reference numeral 2 in FIGS. 1 and 2 comprises an EUV radiation source unit in which EUV radiation is generated by irradiating water droplets or xenon clusters with a high-intensity laser beam. FIG. 3 is a cross-section of an embodiment of such a radiation source unit. This unit comprises a capillary tube 31, one end of which is connected to, for example, a water inlet, for example a water tank 32, and the other end projects into a vacuum space 33. Water is transported at a high pressure through this tube to the vacuum space, which is denoted by arrow 35. The space 33 is connected to a pump 34, for example, a turbo pump having a power of, for example, 1000 dm$^3$/sec, with which the space 33 can be pumped to a vacuum of $10^{-4}$ mbar. The capillary tube 31 is caused to vibrate, for example, by means of a piezoelectric driver 37. At a given vibration frequency, for example 0.3 MHz, the tube supplies a continuous flow of individual water droplets 39. The droplet formation is based on the principle which is comparable with that used in various ink jet printers for forming ink droplets. The water droplets may not only be formed by means of piezoelectric pulses but also by thermal pulses or by ultrasonic means. At a water flow 35 of, for example, 5.4 ml/hour, the water droplets have a diameter of the order of 20 μm.

The radiation source unit further comprises a high-power laser 40, for example, an Nd-YAG laser which supplies laser pulses at a frequency of, for example, 10 Hz and at a pulse duration of, for example, 8 ns and with an energy content of 0.45 Joule. The optical frequency of the laser radiation may be doubled in known manner so that laser radiation with a wavelength of the order of 530 nm is obtained. An excimer laser, for example a Kr-F laser emitting at a wavelength of 248 nm, may be alternatively used as a laser source. The beam 41 emitted by the laser 40 enters, through a window 43, into the wall of the space 33. This beam is focused by a lens system 42, illustrated by a single lens element, to a radiation spot 45 in a position 46 in a plane which is aligned with the centerline of the tube 31 along which the water droplets pass. An absorbing element 55 is arranged behind a second window 44 in the wall of the vacuum space 33, which absorbing element ensures that radiation of the laser beam exiting from the space 33 cannot enter the apparatus of which the radiation source unit forms part. The beam 42 is each time substantially focused on a water droplet which is instantaneously present at the position 46. The radiation spot 45 has a diameter of, for example, 30 μm so that a water droplet is completely irradiated. The driver 37 is synchronized with the laser driver via an electronic circuit 48 comprising a delay element, so that a laser pulse is generated at the instant when a water droplet arrives at the position 46. Due to the laser energy supplied to the water droplet, a plasma 47 in which oxygen ions are present is produced at the location of this droplet. As a result of the extremely high energy density, for example, of the order of $10^{21}$ W/m$^3$ of the laser beam at the location of the droplet, this plasma reaches a temperature which corresponds to an energy of the order of 30 eV. At this high temperature, the dominant ionization state of oxygen O is VI. Then, EUV radiation is generated at wavelengths around 11.6 nm and 13 nm. For further details about the way and circumstances in which EUV radiation is formed, reference is made to the article "Laser produced oxygen plasmas" in Proceedings of the $2^{nd}$ Int. Symp. on Heat and Mass Transfer under Plasma conditions, 1999.

One or more mirrors 49 for collecting, concentrating and directing the generated EUV radiation may be arranged in the space 33. Alternatively, such mirrors may be arranged outside the space so as yet to concentrate and direct the EUV radiation exiting from this space. The number of mirrors required is dependent on the percentage of the EUV radiation which must be collected and used and is emitted by the plasma in all directions.

In the EUV generation process, not all water droplets are converted into a plasma. On their way through the source space, the droplets give off water vapor. Since the vapor pressure of water at room temperature is approximately 23 mbar, the water vapor and the water droplets which have not been converted must be removed from the source space 33 so as to comply with the vacuum requirement in connection with a free passage of the generated EUV radiation. As described in the article mentioned above, excess water droplets may be drained by introducing them into a second vacuum space 50 via a narrow aperture 51. In the space 50, a relatively low vacuum of, for example, 0.5 mbar is maintained by means of a further vacuum pump 53 having a power of, for example, 70 dm$^3$/sec. By means of this special embodiment of the principle of differential pumping, i.e. separate pumping of two communicating spaces to different degrees of vacuum, a relatively satisfactory vacuum, of the order of $2 \times 10^{-4}$ mbar, can in principle be maintained in the source space 33. Moreover, the pumps may be chosen to be such that the remaining water droplets are drained as water vapor. Consequently, the radiation source can be operated continuously and at a constant, rest, pressure level.

This pressure level is determined by the vapor pressure of the water droplets moving from the tube to the space 50. However, this vapor pressure is 23 mbar at room temperature so that, without further measures, still so many water molecules are present in the space 33 that EUV radiation coming from the plasma 47 may be absorbed in this space and the intensity of this radiation is reduced.

The wall of the vacuum space 33 must be further provided with at least one aperture through which the generated EUV radiation can leave the space 33 so as to enable it to enter the space in which the mirrors of the illumination system, 10, 12 and 14 in FIG. 3, are present. This aperture may be located at the position where the window 43 is situated in FIG. 3. It has been found that, due to the presence of such an aperture, the problem not mentioned in the above-mentioned article "Laser produced oxygen plasma" may occur that water emerging from this aperture may drip on the mirrors of the illumination system and on those of the projection system and may attack these mirrors, thus reducing their reflection. This is an important problem in lithographic projection apparatuses because a reduced reflection of the mirrors, whereby less radiation can reach the mask and notably the substrate, has a direct influence on an important performance parameter of such an apparatus, namely the velocity at which substrates can be illuminated.

Figure 4:
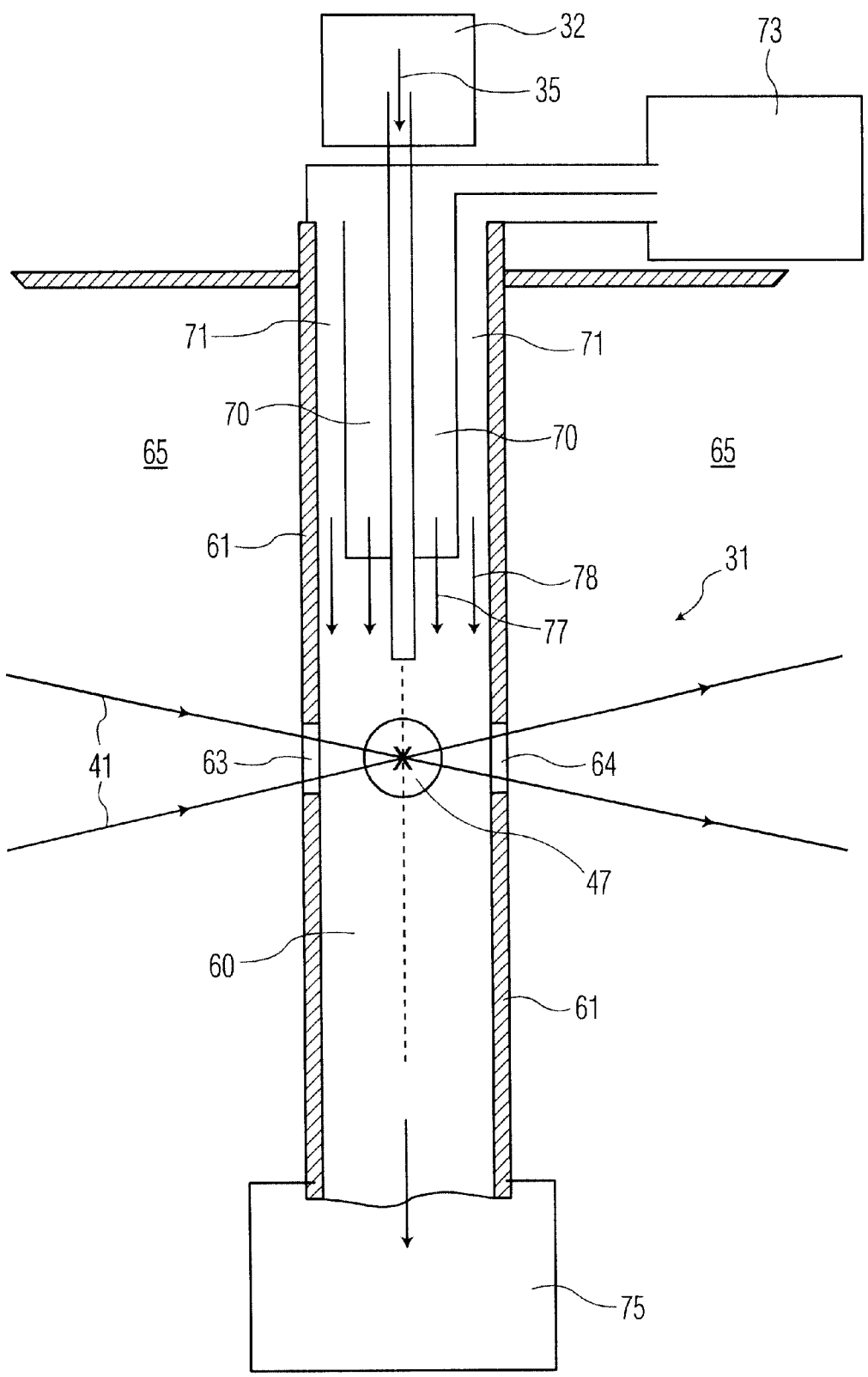
FIGS. 4, 5 and 6 show cross-sections of a part of a first, a second and a third embodiment, respectively, of the radiation source unit according to the invention.

This problem can be eliminated, or at least sufficiently reduced, by making use of a radiation source unit in accordance with the concept of the invention. FIG. 4 shows a cross-section of an embodiment of this radiation source unit. In this Figure, the elements corresponding to those in FIG. 3 are denoted by the same reference numerals. Furthermore, the components of the radiation source unit which are not important for the present invention are no longer shown in this Figure and subsequent Figures. In FIG. 4, the reference numeral 61 denotes the wall of a source space 60 which has the shape of, for example, a cylinder and in which the water flow 35 is introduced through the tube 31 and in which the water droplets (not shown) propagate. This wall is provided with, for example, narrow apertures 63, 64 having a diameter of, for example, 2.5 mm, via which the pulsed laser beam 41 can enter (63) the space 60, or can leave (64) this space. The generated EUV radiation can leave the source space 60, for example, via these apertures or other apertures (not shown) and enter a space 65. In this space, which is only shown diagrammatically and in which a high vacuum of, e.g., $10^{-4}$ mbar is maintained by means of the vacuum pump denoted by the reference numeral 34 in FIG. 3, the EUV radiation is guided towards the mask via the mirrors of the illumination system. The space 65 may also be filled with a rare gas such as helium, or with hydrogen at a low pressure of, for example $10^{-1}$ mbar.

According to the invention, not only a flow of water droplets but also a flow 77, 78 of rare gas, for example helium, is introduced into the source space 60 so that the helium flow is parallel to the flow of individual water droplets leaving the tube 31. To this end, the source space has a tube 70 which communicates with a helium outlet, for example, in the form of a tank 73. This tube has a diameter of, for example, 5 mm. A vacuum pump 75 connected to the source space ensures that a continuous helium flow is maintained and that the helium pressure in the source space will not exceed, for example, $10^{-1}$ mbar. At this low helium pressure, the generated EUV radiation is not absorbed. The water droplets are now encapsulated in a tubular and viscous flow of helium which has a sufficient suction power. As a result, water vapor from the droplets remains enclosed within the helium column and is taken along by the helium flow and transported to the vacuum pump 75. This also applies to water droplets which have not been converted into plasma. The tube 70 ensures that the helium flow is a laminar flow so that the helium gas and the elements of the water present therein cannot flow back.

Due to the interaction of the flow of water droplets with the helium flow, the desired flow profile of the helium flow may be disturbed. To prevent this, a second tube 71 connected to the helium tank 73 is preferably arranged in the source space 60, so that a second helium flow 78 is established coaxially with the first flow 77. The flow profile can be restored again by means of the second flow. Instead of helium, another rare gas may be used for draining water vapor and excess water droplets from the source space. An example of another gas is argon having larger molecules than helium so that an argon flow has a better suction power than helium. However, argon is more absorbing than helium. In the choice of the gas, a compromise must be made between the minimal absorption and the maximal suction power.

By suitable choice of the diameter of the tube 70 and the tube 71, if any, and of the pump speed, it can be ensured that the quantity of rare gas which may leak through the apertures 63, 64 into the space 65 is sufficiently small to maintain a helium pressure of at most 0.1 mbar in the space by means of a suitable pump for this space.

Figure 5:
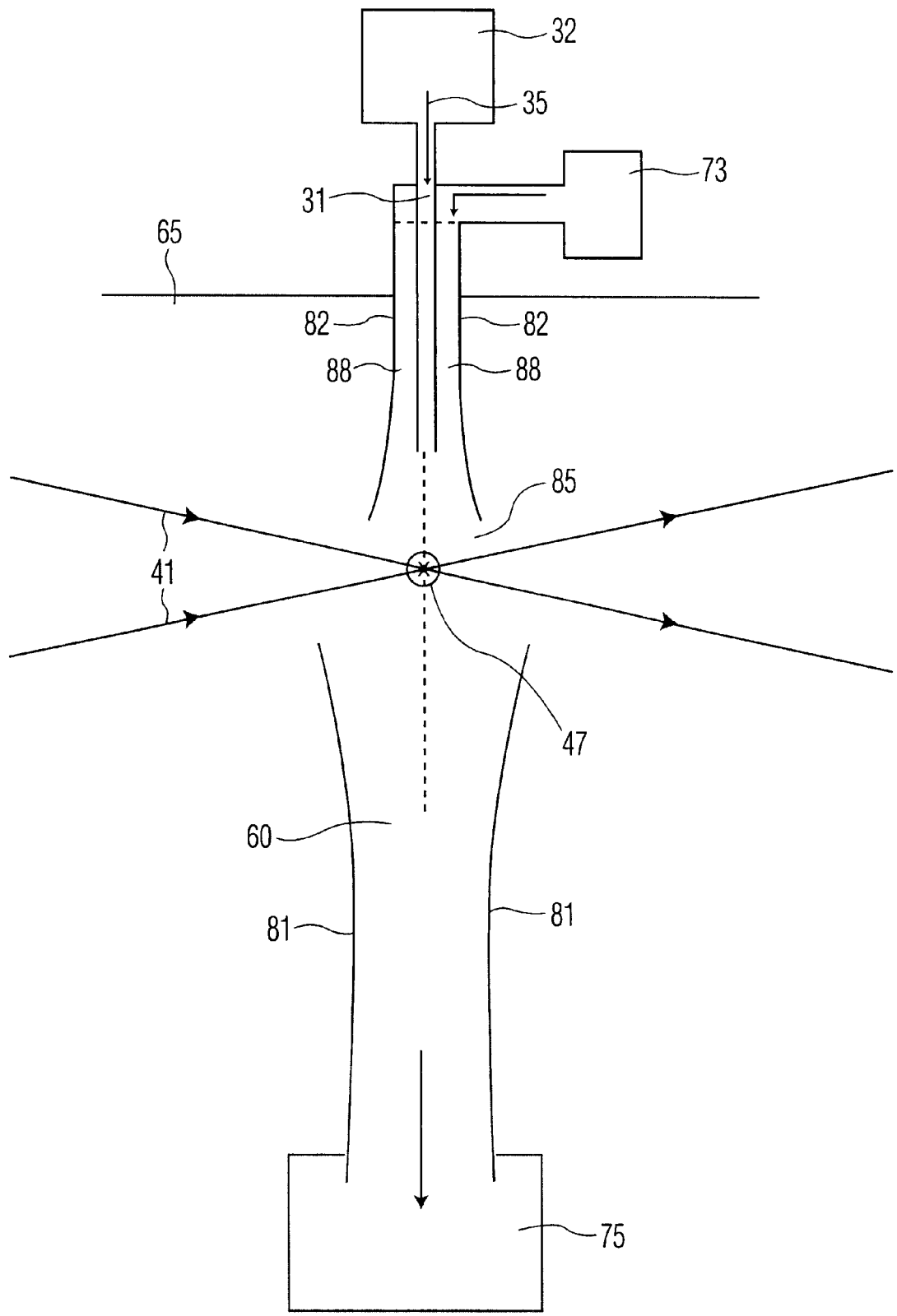

FIG. 5 is a cross-section of a part of a second embodiment of the radiation source unit according to the invention. This embodiment differs from that in FIG. 4, inter alia, in that the source space 60 has a smaller diameter, for example 5 mm, and consists of three parts. The lower part is surrounded by a wall 81. The upper part is closed by the wall 82 of the tube 88 surrounding the inlet tube 31 for the supply of the rare gas. The central part 85 of the source space, at the area of the radiation path of the laser beam 41, communicates with the ambience. At the area of this central part, the walls 81 and 82 are slightly bent outwards so that a so-called ejector configuration, or geometry, is obtained. The combination of the vacuum pump 75 and its specific wall shape at the area of the central part of the source space operates as a so-called ejector pump or jet pump. Such a pump prevents helium or other particles from leaking to the ambience of the source space because it also sucks up possible medium present in this ambience and removes it. The open central part 85 of the source space 60 only needs to have such a height that the converging laser beam 41 can enter the source space in an unhindered way.

Helium gas or another rare gas is supplied from a helium inlet 63 between the tube 31 and the wall 82. This helium gas is sucked downwards by the vacuum pump 75 in the form of a laminar flow and takes along the water vapor and water droplets, if any. Due to the jet pump configuration of the source space, diffusion of water vapor and loss of helium gas to the high-vacuum space 65 is prevented, and this to a stronger extent than is the case in the embodiment of FIG. 4. In this way, the helium gas pressure in the space 65 may be further reduced.

To be able to operate as a jet pump, the straight part of the source space 60 must have a small diameter, for example, 5 mm. Then, the laser beam must be focused substantially on the position where the water droplets pass. Then there is a greater risk that the beam radiation does not impinge upon a desired water droplet, as compared with the case where the laser beam is focused at some distance from said position and hence this beam has a larger diameter at this position. Moreover, when focusing the laser beam on said position, the laser radiation has a large energy density at that position. When irradiating a water droplet and forming a plasma, matter particles, such as highly energetic ions and radicals, may be released, while the number of these particles increases with an increasing density of the laser energy. These particles may also get into the high-vacuum space 65 and reach the mirrors of the illumination system and of the projection system, where they attack the mirror coatings and reduce their reflection.

Figure 6:
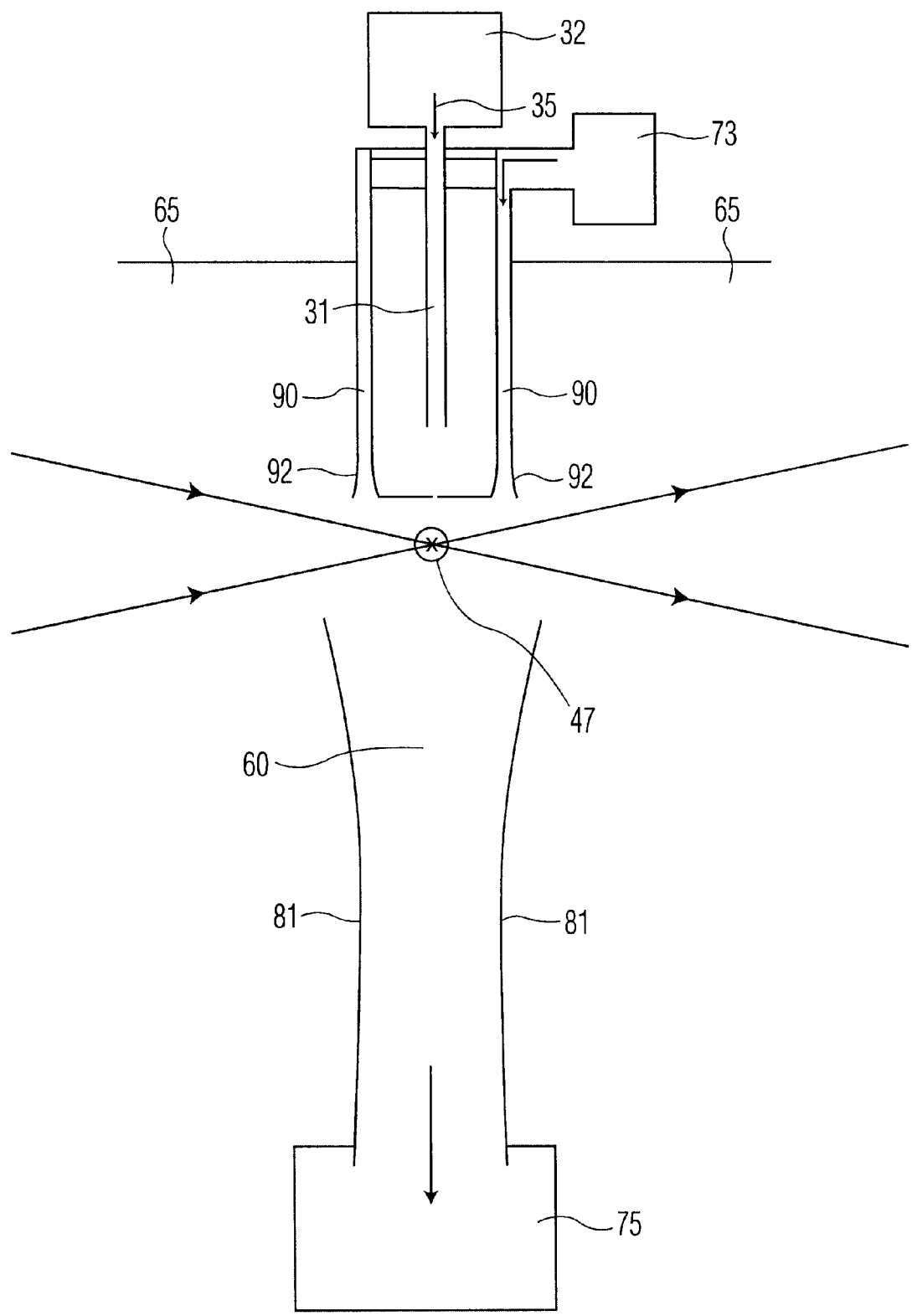

These possible problems are mitigated by the embodiment shown in FIG. 6. This embodiment also comprises a jet pump. However, the inlet tube 90 now has an annular cross-section, with the width of the ring, for example 1 mm, being considerably smaller than its internal diameter which is, for example, 10 mm. The wall portions 92 and the upper parts of the wall 81 again constitute an ejector configuration. The gas curtain supplied through the tube 90 ensures that both the water vapor of the water droplets and the water droplets which have not been converted into a plasma as well as the energy-rich ions and radicals from a plasma remain enclosed and are drained to the pump 75. The jet pump configuration ensures that the gas curtain moves downwards at a great velocity and prevents rare gas particles from leaking to the high-vacuum space 65. Since the jet tube has an annular cross-section, the source space 60 may have a relatively large diameter so that the laser beam can be focused at some distance from the position where the water droplets pass so that the risk of missing a droplet will thus become smaller. Moreover, the energy density of the laser radiation in a droplet is considerably smaller in the embodiment of FIG. 5, so that the number of energy-rich ions and radicals repelled by the plasma is smaller. The embodiment of FIG. 6 thus combines the advantages of the embodiment of FIG. 5 with those of the embodiment of FIG. 4.

For the theoretical background and details about ejector pumps, reference is made to the article "Exit Flow Properties of Annular Jet-Diffuser Ejectors" in Journal of the Chinese Society of Mechanical Engineers, Vol. 18, No. 2, pp. 1113–125, 1997.

The fact that water droplets are used as a medium for forming the plasma in the embodiment described hereinbefore does not mean that the invention is limited thereto. As has been described in the article "Debris elimination in a droplet target laser plasma soft X-ray source" in Rev., Sci. Instruments 66 (10), October 1995, pp. 4916–4920, ethanol droplets may be alternatively used as a medium for forming a plasma emitting EUV radiation. Similar problems as with water droplets occur, which problems can be solved by using the invention.

Water and ethanol are only two examples of possible liquid media which, if irradiated with a high-power pulsed laser, form an EUV radiation emitting plasma and can be used in a laser-generated plasma EUV radiation source. Generally, the invention can be used in all EUV radiation sources in which a liquid medium is converted by a high-power pulsed laser into an EUV radiation-emitting plasma and in which the problems occur that the medium raises the (vapor) pressure in the source space and the plasma formed repels contaminating particles which may penetrate the high-vacuum space and reduce the reflection of the mirrors which are present in this space.

Gaseous media instead of liquid media may be alternatively used in an EUV radiation source. For several years, theories have been developed about and experiments have been carried out on the interaction between high laser and xenon clusters for creating a plasma which emits EUV radiation to a sufficient extent, as was recently reported from different research centers at the OSA conference on applications of high field and short-wavelength sources VIII (1999). However, xenon gas absorbs EUV radiation to a great extent so that, without further measures, the EUV radiation output of a xenon plasma source would be too small to operate projection lithography with such a source. By enclosing the xenon gas and draining it with a flow or a curtain of rare gas such as helium according to the invention, it can be achieved that absorption of the generated EUV radiation is reduced considerably.

The embodiments shown in FIGS. 4, 5 and 6 may be used, in which xenon clusters are supplied via a tube which is similar to the tube 31 in the Figures, which tube is then not caused to vibrate.

As regards their physical state, xenon clusters occupy a position between molecules and a solid material. Such clusters can be injected into a source space by means of a pulsed valve having an aperture diameter of, for example, 2 mm. If such a cluster in this space is excited by laser pulses of, for example, a Kr-F excimer laser, which laser pulses have a very short pulse duration of, for example, 0.35 p/sec and a power of, for example, 20 mjoule, then there will be a strong ionization of the cluster and it will emit EUV radiation at a wavelength of the order of 11 nm. The strong absorption of the EUV radiation formed can be prevented and the collection and drainage of energy-rich ions can be ensured by making use of the present invention and the various embodiments described.

The invention may also be used in an EUV radiation source unit in which a tape or wire of a metal is used as a medium. The problem when using a metal medium is that, when it is impinged upon by a laser beam to obtain the desired plasma, the metal is locally caused to explode so that metal particles are released. If these particles get outside the source space, they will have a destructive effect on the optical components of the apparatus incorporating the radiation source unit. The present invention and its various embodiments provide an eminent possibility of preventing this.

EUV radiation sources may not only be used in lithographic projection apparatuses but also in EUV microscopes having a very high resolving power. The radiation path of the EUV radiation in such a microscope must be in a high vacuum. To prevent the vacuum from being attacked from the radiation source and from contaminating the optical components, the invention and its various described embodiments may be used to great advantage.

It has been noted hereinbefore that EUV radiation is also known as soft X-ray radiation because its wavelength is close to that of real X-ray radiation having a wavelength of the order of 1 nm or less. It has also been noted that the wavelength of the radiation generated with the described radiation sources is dependent on, inter alia, the medium used. For generating X-ray radiation, similar radiation sources, with similar problems as for generating EUV radiation may therefore be used. For this reason, the present invention may also be used to great advantage in X-ray sources and this invention also relates to these sources and apparatuses such as an X-ray microscope or an X-ray analysis apparatus, hence the use in the claims of the term extremely short-wave radiation which is understood to be EUV radiation and X-ray radiation.

What is claimed is:

1. A method of generating extremely short-wave radiation, in which a medium is transported through a vacuum space and each time a part of the medium in the vacuum space is irradiated with a pulsed and focused energy-rich laser beam, said part of the medium being converted into a plasma emitting extremely short-wave radiation, characterized in that the medium is embedded in at least a viscous flow of rare gas which is transported through the vacuum space parallel to the direction of movement of the medium.

2. A method as claimed in claim 1, characterized in that at least two viscous flows of rare gas are passed through a part of the vacuum space in which a part of the medium, which is not yet irradiated, propagates.

3. A method as claimed in claim 1, characterized in that helium gas is used as a rare gas.

4. A method as claimed in claim 1, characterized in that a metal is used as a medium which, upon irradiation with a laser beam, forms a plasma emitting extremely short-wave radiation.

5. A method as claimed in claim 1, characterized in that a continuous flow of individual liquid droplets is used as a medium which, upon irradiation with a laser beam, forms a plasma emitting extremely short-wave radiation.

6. A method as claimed in claim 5, characterized in that water droplets are used as liquid droplets.

7. A method as claimed in claim 1, characterized in that a clustered gas is used as a medium which, upon radiation with a laser beam, forms a plasma emitting extremely short-wave radiation.

8. A method as claimed in claim 7, characterized in that the gas is xenon.

9. A method of manufacturing a device, in which the dimensions of the smallest details are smaller than 0.25 $\mu$m, on a substrate, in which method different layers of the device are formed in successive steps by imaging by means of EUV radiation, for each layer, first a specific mask pattern on the substrate coated with a radiation-sensitive layer and by subsequently removing material from, or adding material to, areas marked by the mask image, characterized in that the EUV radiation is generated by means of the method as claimed in any one of claim 1.

10. An extremely short-wave radiation source unit comprising:
    a source space connected on a first side to a vacuum pump;
    an inlet device provided on a second side of the source space for introducing the medium into the source space;
    a pulsed high-power laser, and
    an optical system for focusing the laser beam supplied by the laser on a fixed position within the source space where the mobile medium passes, characterized in that the source space on the second side is connected to a rare gas inlet for establishing a viscous flow of rare gas in the source space enveloping the medium, which flow is parallel to the direction of movement of the medium.

11. An extremely short-wave radiation source unit as claimed in claim 10, in which the source space is enclosed by a wall having apertures for causing the laser beam to enter into and exit from the source space and for causing the generated extremely short-wave radiation to exit from the source space, characterized in that a tube is arranged in the source space on the second side of the source space and parallel to the direction of movement of the medium, which tube is connected to said inlet for establishing the viscous flow of rare gas.

12. An extremely short-wave radiation source unit as claimed in claim 11, characterized in that a second tube is arranged parallel to the first tube in the source space, which second tube is connected to said inlet for establishing a second viscous flow of rare gas parallel to the direction of movement of the medium.

13. An extremely short-wave radiation source unit as claimed in claim 10, characterized in that the source space is formed by a first closed part on the first side, a second closed part on the second side and a central part which communicates with the ambience, in that the wall of the second source space part is formed by a tube which is connected to said rare gas inlet, and in that the wall of the tube and the wall of the first source space part have such a shape at the area of the central part of the source space that they constitute an ejector geometry.

14. An extremely short-wave radiation source unit as claimed in claim 10, characterized in that the source space is formed by a first closed part on the first side, a second closed part on the second side and a central part which communicates with the ambience, in that the wall of the second source space part is formed by an annular tube which is connected to said rare gas inlet, and in that the wall of the tube and the wall of the first source space part have such a shape at the area of the central part of the source space that they constitute an annular ejector geometry.

15. An extremely short-wave radiation source unit as claimed in claim 10, characterized in that the inlet device is a device for transporting a metal tape or wire through the source space.

16. An extremely short-wave radiation source unit as claimed in claim 10, characterized in that the inlet device has a tube for introducing a mobile medium into the source space.

17. An extremely short-wave radiation source unit as claimed in claim 16, characterized in that the mobile medium is formed by liquid droplets.

18. An extremely short-wave radiation source unit as claimed in claim 17, characterized in that the liquid droplets are water droplets.

19. An extremely short-wave radiation source unit as claimed in claim 16, characterized in that the mobile medium is formed by a clustered gas.

20. An extremely short-wave radiation source unit as claimed in claim 19, characterized in that the gas is xenon.

21. An extremely short-wave radiation source unit as claimed in claim 16, characterized in that the inlet device comprises means for causing the tube for the mobile medium to vibrate.

22. A lithographic projection apparatus for imaging a mask pattern on a substrate provided with a radiation-sensitive layer, which apparatus comprises an illumination system for illuminating the mask pattern and a projection system for imaging the illuminated mask pattern on the substrate, the illumination system comprising an EUV radiation source, while the optical components of the illumination system and those of the projection system are present in a vacuum space, characterized in that the EUV radiation source is a radiation source unit as claimed in claim 10.

* * * * *